(12) United States Patent
Lee et al.

(10) Patent No.: US 12,298,352 B2
(45) Date of Patent: May 13, 2025

(54) SYSTEM AND METHOD FOR MANAGING VEHICLE BATTERY

(71) Applicants: Hyundai Motor Company, Seoul (KR); Kia Corporation, Seoul (KR)

(72) Inventors: Sung Il Lee, Hwaseong-si (KR); Woo Sung Kim, Hwaseong-si (KR); Kyung In Min, Hwaseong-si (KR); Do Sung Hwang, Hwaseong-si (KR); Ki Seung Baek, Hwaseong-si (KR); Dong Il Kim, Hwaseong-si (KR); Dae Gun Jin, Hwaseong-si (KR); Yoon Jun Lee, Hwaseong-si (KR); Bo Ram Yang, Hwaseong-si (KR); Ki Chul Hong, Hwaseong-si (KR); Ik Kyu Kim, Hwaseong-si (KR); Jae Shin Yi, Hwaseong-si (KR); Young Woo Lee, Hwaseong-si (KR); Soo Yang Jin, Hwaseong-si (KR); Hyun Jin Park, Hwaseong-si (KR); Suk Hyung Kim, Hwaseong-si (KR); Hyun Soo Park, Hwaseong-si (KR)

(73) Assignees: HYUNDAI MOTOR COMPANY, Seoul (KR); KIA CORPORATION, Seoul (KR)

( * ) Notice: Subject to any disclaimer, the term of this patent is extended or adjusted under 35 U.S.C. 154(b) by 476 days.

(21) Appl. No.: 17/520,013

(22) Filed: Nov. 5, 2021

(65) Prior Publication Data

US 2022/0144097 A1    May 12, 2022

Related U.S. Application Data

(60) Provisional application No. 63/110,744, filed on Nov. 6, 2020.

(51) Int. Cl.
*G01R 31/389* (2019.01)
*B60L 3/00* (2019.01)
(Continued)

(52) U.S. Cl.
CPC .......... *G01R 31/389* (2019.01); *B60L 3/0046* (2013.01); *B60L 50/60* (2019.02); (Continued)

(58) Field of Classification Search
CPC ................ G01R 31/389; G01R 31/367; G01R 31/3835; G01R 31/3842; G01R 31/392; (Continued)

(56) References Cited

U.S. PATENT DOCUMENTS 7,154,247 B2 * 12/2006 Kikuchi ........... G01R 19/16542
320/132
7,456,612 B2 * 11/2008 Murakami .............. B60L 58/20
320/132

(Continued)

FOREIGN PATENT DOCUMENTS

CA         2851503 C  *  1/2020  .......... B60L 15/2045
CN     103229346 A      7/2013
(Continued)

OTHER PUBLICATIONS

Office Action issued on Feb. 27, 2024 in U.S. Appl. No. 17/518,986.
(Continued)

*Primary Examiner* — M Baye Diao
(74) *Attorney, Agent, or Firm* — Morgan, Lewis & Bockius LLP

(57) ABSTRACT

A system for managing a vehicle battery that is chargeable/dischargeable and stores energy for driving a vehicle driving motor is disclosed. The system for managing a vehicle battery as disclosed includes a controller that measures a voltage of each of a plurality of battery cells in a vehicle
(Continued)

battery when a voltage applied to the vehicle battery is constant, and determines whether the plurality of battery cells is abnormal based on a deviation between the measured voltages of the plurality of battery cells.

7 Claims, 5 Drawing Sheets

(51) Int. Cl.
*B60L 50/60* (2019.01)
*B60L 58/10* (2019.01)
*B60L 58/12* (2019.01)
*B60L 58/16* (2019.01)
*B60L 58/21* (2019.01)
*G01R 31/367* (2019.01)
*G01R 31/3835* (2019.01)
*G01R 31/3842* (2019.01)
*G01R 31/392* (2019.01)
*G05B 23/02* (2006.01)
*G07C 5/00* (2006.01)
*G07C 5/08* (2006.01)
*H01M 10/42* (2006.01)
*H01M 10/48* (2006.01)

(52) U.S. Cl.
CPC .............. *B60L 58/10* (2019.02); *B60L 58/12* (2019.02); *B60L 58/16* (2019.02); *B60L 58/21* (2019.02); *G01R 31/367* (2019.01); *G01R 31/3835* (2019.01); *G01R 31/3842* (2019.01); *G01R 31/392* (2019.01); *G07C 5/008* (2013.01); *G07C 5/0825* (2013.01); *H01M 10/425* (2013.01); *H01M 10/482* (2013.01); *H01M 10/486* (2013.01); *B60L 2240/545* (2013.01); *B60L 2240/547* (2013.01); *G05B 23/0218* (2013.01); *G05B 23/0256* (2013.01); *H01M 2010/4271* (2013.01); *H01M 2220/20* (2013.01)

(58) Field of Classification Search
CPC ..... G01R 31/378; B60L 3/0046; B60L 50/60; B60L 58/10; B60L 58/12; B60L 58/16; B60L 58/21; B60L 2240/545; B60L 2240/547; B60L 2240/549; B60L 2250/16; B60L 58/18; B60L 2240/60; G07C 5/008; G07C 5/0825; G07C 5/0808; H01M 10/425; H01M 10/482; H01M 10/486; H01M 2010/4271; H01M 2220/20; G05B 23/0218; G05B 23/0256; B60W 50/14; G08B 25/10; B60K 35/00; B60K 35/22; B60R 16/023; B60Y 2200/91; Y02T 10/70; Y02T 10/7072
USPC .......................................... 320/109
See application file for complete search history.

(56) References Cited

U.S. PATENT DOCUMENTS

| | | | | |
|---|---|---|---|---|
| 7,589,492 B2* | 9/2009 | Ooishi | ............. | G01R 19/16542 |
| | | | | 320/104 |
| 7,821,234 B2* | 10/2010 | Moriya | ............. | G01R 31/3842 |
| | | | | 324/426 |
| 7,893,652 B2* | 2/2011 | Suzuki | ............. | H02J 7/0016 |
| | | | | 320/132 |
| 7,990,109 B2* | 8/2011 | White | ............. | H01M 50/574 |
| | | | | 320/136 |
| 8,000,915 B2* | 8/2011 | Furukawa | ......... | G01R 31/3835 |
| | | | | 702/63 |
| 8,219,333 B2* | 7/2012 | Li | ........... | G01R 31/36 |
| | | | | 702/63 |
| 8,878,493 B2* | 11/2014 | Kobayashi | ......... | H01M 10/482 |
| | | | | 320/122 |
| 9,461,320 B2 | 10/2016 | Ballantine et al. | | |
| 9,465,084 B2 | 10/2016 | Park | | |
| 9,577,458 B2* | 2/2017 | Kaita | ................ | B60L 58/15 |
| 9,685,807 B2* | 6/2017 | Nakao | ............... | G01R 31/374 |
| 9,720,047 B2* | 8/2017 | Joe | ........... | B60L 58/12 |
| 10,132,868 B2* | 11/2018 | Sun | ................ | H01M 50/581 |
| 10,261,136 B2 | 4/2019 | Hosaka et al. | | |
| 10,830,829 B2* | 11/2020 | Gelso | ............... | G01R 31/396 |
| 11,316,352 B2* | 4/2022 | Hale | ................ | H01M 10/46 |
| 11,491,877 B2* | 11/2022 | Sato | ............... | H02J 7/00 |
| 11,691,518 B2* | 7/2023 | Holme | ............... | B60L 58/16 |
| | | | | 701/22 |
| 12,024,052 B2* | 7/2024 | Kim | ................ | B60L 3/12 |
| 2002/0121902 A1 | 9/2002 | Suzuki | | |
| 2004/0178798 A1* | 9/2004 | Kikuchi | ........... | G01R 19/16542 |
| | | | | 324/426 |
| 2006/0186890 A1 | 8/2006 | Wane et al. | | |
| 2007/0052424 A1 | 3/2007 | Okumura | | |
| 2008/0053715 A1* | 3/2008 | Suzuki | ............ | B60L 58/12 |
| | | | | 320/136 |
| 2009/0271132 A1* | 10/2009 | Furukawa | ......... | G01R 31/3835 |
| | | | | 702/63 |
| 2010/0224157 A1 | 9/2010 | Mizuno | | |
| 2011/0006731 A1* | 1/2011 | Wang | ............ | B60L 53/14 |
| | | | | 320/109 |
| 2012/0019253 A1 | 1/2012 | Ziegler et al. | | |
| 2012/0112703 A1* | 5/2012 | Xu | ............ | H02J 7/0013 |
| | | | | 320/145 |
| 2013/0141109 A1 | 6/2013 | Love et al. | | |
| 2013/0342212 A1 | 12/2013 | Kawahira et al. | | |
| 2014/0159738 A1 | 6/2014 | Jeong et al. | | |
| 2014/0218042 A1 | 8/2014 | Koba et al. | | |
| 2014/0333315 A1* | 11/2014 | Yamamoto | ......... | G01R 31/3835 |
| | | | | 324/426 |
| 2015/0228990 A1 | 8/2015 | Ballantine et al. | | |
| 2015/0288197 A1 | 10/2015 | Choi | | |
| 2016/0069963 A1 | 3/2016 | Hebiguchi | | |
| 2017/0018823 A1* | 1/2017 | Kwon | ............. | H01M 10/663 |
| 2017/0160327 A1 | 6/2017 | Jung et al. | | |
| 2017/0279164 A1* | 9/2017 | Herrema | ............. | H01M 10/484 |
| 2018/0003411 A1 | 1/2018 | Taylor et al. | | |
| 2018/0062210 A1 | 3/2018 | Kim | | |
| 2018/0106869 A1* | 4/2018 | Gelso | ............... | G01R 19/16542 |
| 2019/0146040 A1 | 5/2019 | Murakami et al. | | |
| 2019/0337403 A1 | 11/2019 | Tanaka | | |
| 2020/0072909 A1 | 3/2020 | Soejima et al. | | |
| 2020/0096572 A1 | 3/2020 | You et al. | | |
| 2020/0158784 A1 | 5/2020 | Fabregas et al. | | |
| 2020/0326378 A1 | 10/2020 | Oono et al. | | |
| 2020/0391610 A1 | 12/2020 | Park et al. | | |
| 2020/0412153 A1* | 12/2020 | Matsumura | ......... | H02J 7/0031 |
| 2021/0231743 A1 | 7/2021 | Christopherson | | |
| 2021/0323442 A1 | 10/2021 | Wu et al. | | |
| 2022/0111759 A1 | 4/2022 | Ijaz | | |
| 2022/0149630 A1* | 5/2022 | Burchardt | ............... | H02J 3/003 |

FOREIGN PATENT DOCUMENTS

| | | | | |
|---|---|---|---|---|
| CN | 203909253 U | | 10/2014 | |
| CN | 106772099 A | | 5/2017 | |
| CN | 109613432 A | * | 4/2019 | .......... G01R 31/367 |
| CN | 110165316 A | | 8/2019 | |
| DE | 10 2015 203 878 A1 | | 9/2016 | |
| DE | 10 2019 110 349 A1 | | 10/2020 | |
| EP | 0 438 477 B1 | | 9/1995 | |
| EP | 1316458 A1 | * | 6/2003 | .............. B60K 6/38 |
| EP | 1919059 A2 | * | 5/2008 | .............. B60L 58/18 |
| EP | 1846776 B1 | * | 8/2011 | .............. B60L 3/12 |
| EP | 2403105 A2 | * | 1/2012 | ............ B60L 3/0046 |
| EP | 4 095 957 A1 | | 11/2022 | |
| FR | 3029299 A1 | * | 6/2016 | .......... G01R 31/007 |
| JP | 2004328902 A | * | 11/2001 | .............. Y02E 60/10 |
| JP | 2002008733 A | * | 1/2002 | .............. G01R 31/36 |
| JP | 2002084666 A | * | 3/2002 | .............. Y02E 60/10 |

(56) References Cited

FOREIGN PATENT DOCUMENTS

| | | | | | |
|---|---|---|---|---|---|
| JP | 2006-292565 | A | 10/2006 | | |
| JP | 2007-085772 | A | 4/2007 | | |
| JP | 2007-292666 | A | 11/2007 | | |
| JP | 2007-333494 | A | 12/2007 | | |
| JP | 2009-190690 | A | 8/2009 | | |
| JP | 4919120 | B2 | 4/2012 | | |
| JP | 2013-083522 | A | 5/2013 | | |
| JP | 2014-134467 | A | 7/2014 | | |
| JP | 2018-181430 | A | 11/2018 | | |
| JP | 6566425 | B2 | 8/2019 | | |
| KR | 10-20080074240 | A | 8/2008 | | |
| KR | 20120016993 | A | * | 2/2012 | .......... H01M 10/441 |
| KR | 10-2013-0061964 | A | 6/2013 | | |
| KR | 10-2013-0075379 | A | 7/2013 | | |
| KR | 10-2014-0075983 | A | 6/2014 | | |
| KR | 10-2014-0093122 | A | 7/2014 | | |
| KR | 20140122520 | A | * | 10/2014 | .......... H01M 10/482 |
| KR | 20150052384 | A | * | 5/2015 | .......... G01R 31/367 |
| KR | 10-1558696 | B1 | 10/2015 | | |
| KR | 10-1755910 | B1 | 7/2017 | | |
| KR | 10-2017-0109435 | A | 9/2017 | | |
| KR | 10-1818515 | B1 | 1/2018 | | |
| KR | 10-2018-0056091 | A | 5/2018 | | |
| KR | 10-2018-0067140 | A | 6/2018 | | |
| KR | 10-1942707 | B1 | 1/2019 | | |
| KR | 10-1955537 | B1 | 3/2019 | | |
| KR | 102017573 | B1 | * | 9/2019 | .......... G01R 31/3835 |
| KR | 10-2020-0022639 | A | 3/2020 | | |
| KR | 10-2020-0038005 | A | 4/2020 | | |
| KR | 10-2020-0143019 | A | 12/2020 | | |
| KR | 10-2229019 | B1 | 3/2021 | | |
| KR | 10-2022-0006270 | A | 1/2022 | | |
| KR | 10-2022-0012483 | A | 2/2022 | | |
| KR | 10-2022-0060083 | A | 5/2022 | | |
| TW | 1404644 | B | * | 8/2013 | ............. Y02T 10/70 |
| WO | 2015/123304 | A1 | 8/2015 | | |
| WO | 2016/071801 | A1 | 5/2016 | | |
| WO | WO-2016147326 | A1 | * | 9/2016 | ................ H02J 3/38 |
| WO | WO-2019008367 | A1 | * | 1/2019 | .......... H01M 10/052 |

OTHER PUBLICATIONS

Koch et al. (2014), Electrochemical Impedance Spectroscopy for Online Battery Monitoring-Power Electronics Control, 16th European Conference on Power Electronics and Applications.
Christensen et al. (2013), Using on-board Electrochemical Impedance Spectroscopy in Battery Management Systems, EVS27 Barcelona, Spain.
Takeno et al. (2004), Quick testing of batteries in lithium-ion battery packs with impedance-measuring technology, Journal of Power Sources, 128: 67-75.
U.S. Office Action dated Jan. 3, 2023, issued in corresponding U.S. Appl. No. 17/518,986.
U.S. Final Office Action dated Jun. 26, 2023, issued in corresponding U.S. Appl. No. 17/518,986.
Office Action issued on Sep. 25, 2024 in U.S. Appl. No. 17/520,007.
Office Action issued on Jun. 17, 2024 in corresponding U.S. Appl. No. 17/520,065.
Notice of Allowance issued on Mar. 25, 2025 in regard to the U.S. Appl. No. 17/518,991.

* cited by examiner

SYSTEM AND METHOD FOR MANAGING VEHICLE BATTERY

CROSS-REFERENCE TO RELATED APPLICATION

This application is a non-provisional patent application of the provisional patent application No. 63/110,744 filed on Nov. 6, 2020, the disclosures of which are incorporated herein by reference in their entirety.

BACKGROUND OF THE INVENTION

Field of the Invention

The present invention relates to a system and method for managing a vehicle battery, and more particularly, to a system and method for managing a vehicle battery that effectively monitors a state of a battery in a parking state of a vehicle after charging the battery of the vehicle, so that various problems occurring in the battery in the vehicle parking state can be prevented in advance.

Description of the Related Art

In general, an eco-friendly vehicle driven using electric energy is a vehicle that generates power by driving a motor, which is an electric rotation mechanism, using the electric energy stored in a battery. The dynamic performance of such an eco-friendly vehicle is closely related to the performance of the battery, so efficient monitoring and management of the battery is essential.

In general, the battery of an eco-friendly vehicle is managed by a controller commonly referred to as a battery management system (BMS). The battery management system collects various information for battery management (battery voltage, battery current, battery temperature, etc.) from the battery and applies the collected information to various prestored algorithms to calculate various parameters for battery management.

A conventional vehicle battery management technique is mainly performed in a state in which power is supplied to the battery management system, that is, in a power-on (IG ON) state. That is, a main relay connected to the battery monitors the state of the battery in a state in which an electrical connection between the battery and other components of the vehicle (for example, a power module that converts power from the battery to provide it to a motor or a charger that generates power for charging the battery) is established.

As described above, in the conventional vehicle battery management technique, since information for battery management is collected in a state in which the battery and other components are electrically connected, there is a problem in that the collected information is affected by other components, thereby preventing accurate battery condition monitoring.

In particular, in recent years, fatal accidents such as a fire occurring in a battery in a parking state of a vehicle occur frequently, so a technique that can determine in advance whether a battery is abnormal in a parking state of a vehicle and warn it before an accident occurs is required in a relevant technical field.

The matters described as the background art above are only for improving the understanding of the background of the present invention, and should not be taken as acknowl-edging that they correspond to the prior art already known to those of ordinary skill in the art.

SUMMARY OF THE INVENTION

Accordingly, a technical object of the present invention is to provide a system and method for managing a vehicle battery capable of predetermining whether a battery is abnormal even when the battery is in a no-load state after charging the battery in a vehicle and warning it.

In order to achieve the above object, the present invention provides a system for managing a vehicle battery that is chargeable/dischargeable and stores energy for driving a vehicle driving motor, the system comprising: a controller that measures a voltage of each of a plurality of battery cells in a vehicle battery when a voltage applied to the vehicle battery is constant, and determines whether the plurality of battery cells is abnormal based on a deviation between the measured voltages of the plurality of battery cells.

In an embodiment of the present invention, the controller may measure the voltage of each of the plurality of battery cells when the vehicle battery is charged with a constant current.

In an embodiment of the present invention, the controller may measure the voltage of each of the plurality of battery cells when the vehicle battery is in a no-load state.

In an embodiment of the present invention, the controller may measure a polarization voltage corresponding to a decrease in voltage of each of the battery cells that occurs during a preset time interval from a time point when the vehicle battery starts with a no-load state, and may determine whether the plurality of battery cells is abnormal based on the deviation between the polarization voltages of the plurality of battery cells.

In an embodiment of the present invention, the controller may compare a deviation between a maximum value and a minimum value among the measured voltages of the plurality of battery cells with a preset reference value, and may determine that abnormality is occurred in the battery cells when the deviation between the maximum value and the minimum value is greater than the reference value.

In an embodiment of the present invention, the reference value may be preset to be a larger value as a total mileage of the vehicle increases.

In an embodiment of the present invention, the controller may measure a polarization voltage corresponding to a decrease in voltage of each of the plurality of battery cells in the vehicle battery for a preset time interval immediately after charging of the vehicle battery is terminated, for each preset total mileage of the vehicle, and may determine the reference value corresponding to the preset total mileage based on a magnitude ratio of the polarization voltage and a charging current applied to the vehicle battery immediately before charging of the vehicle battery is terminated.

In an embodiment of the present invention, the system may further include a cluster or an audio video navigation (AVN) that displays occurrence of abnormality in the battery cells when the controller determines that abnormality is occurred in the battery cells.

In an embodiment of the present invention, the cluster or the AVN may include a communication module that wirelessly transmits the occurrence of abnormality in the battery cells to a vehicle management server or a wireless terminal of a driver of the vehicle.

In order to achieve the above object, the present invention provides a method for managing a vehicle battery that is chargeable/dischargeable and stores energy for driving a vehicle driving motor, the method comprising the steps of determining whether a voltage applied to a vehicle battery is in a constant state; measuring a voltage of each of a plurality of battery cells in the vehicle battery when the voltage applied to the vehicle battery is constant; calculating a deviation between a maximum value and a minimum value of the measured voltages of the respective battery cells; and comparing the deviation with a preset reference value and determining whether abnormality is occurred in the battery cells based on a result of the comparison.

In an embodiment of the present invention, in the step of determining, the voltage applied to the vehicle battery may be determined to be constant when the vehicle battery is charged with a constant current.

In an embodiment of the present invention, in the step of determining, the voltage applied to the vehicle battery may be determined to be constant when the vehicle battery is in a no-load state.

In an embodiment of the present invention, in the step of measuring, a polarization voltage corresponding to a decrease in voltage of each of the battery cells that occurs during a preset time interval from a time point when the vehicle battery starts with a no-load state may be measured, and in the step of determining, whether the plurality of battery cells is abnormal may be determined based on a deviation between the polarization voltages of the plurality of battery cells.

In an embodiment of the present invention, in the step of determining, the occurrence of abnormality in the battery cells may be determined when the deviation is compared with the preset reference value and the deviation is greater than the preset reference value.

In an embodiment of the present invention, the reference value may be preset to be a larger value as a total mileage of the vehicle increases.

In an embodiment of the present invention, for each preset total mileage of the vehicle, the reference value may be determined to correspond to the preset total mileage based on a magnitude ratio of the polarization voltage corresponding to a decrease in voltage of each of the plurality of battery cells in the vehicle battery for a preset time interval immediately after charging of the vehicle battery is terminated, and a charging current applied to the vehicle battery immediately before the charging of the vehicle battery is terminated.

In an embodiment of the present invention, the method may further include the step of displaying the occurrence of abnormality in the battery cells on a cluster or audio video navigation (AVN) of the vehicle when the controller determines the occurrence of abnormality in the battery cells.

In an embodiment of the present invention, the step of displaying may include the step of wirelessly transmitting the occurrence of abnormality in the battery cells to a vehicle management server or a wireless terminal of a driver of the vehicle.

According to the system and method for managing a vehicle battery, the voltage deviation of the battery cells is calculated in a state in which a constant current is applied to the vehicle battery or in the no-load state of the battery, so that it is possible to determine stably whether the battery is abnormal based on the deviation of the battery voltages.

In particular, according to the system and method for managing a vehicle battery, since whether the battery is abnormal may be determined based on the voltage deviation of the battery cells even in a parked state, it is possible to prevent in advance the occurrence of a serious accident, such as a sudden ignition of a battery in a parked vehicle.

In addition, according to the system and method for managing a vehicle battery, the reference value compared with the voltage deviation of the battery cells to determine the abnormality of the battery is changed according to the number of times or period of use of the battery, so that it is possible to accurately determine whether the abnormality is occurred in the battery cells until a battery lifespan expires.

The effects obtainable in the present invention are not limited to the above-mentioned effects, and other effects not mentioned will be clearly understood by those of ordinary skill in the art from the following description.

DETAILED DESCRIPTION OF THE INVENTION

Hereinafter, a system and method for managing a vehicle battery according to an embodiment of various embodiments of the present invention will be described in detail with reference to the accompanying drawings.

Figure 1:
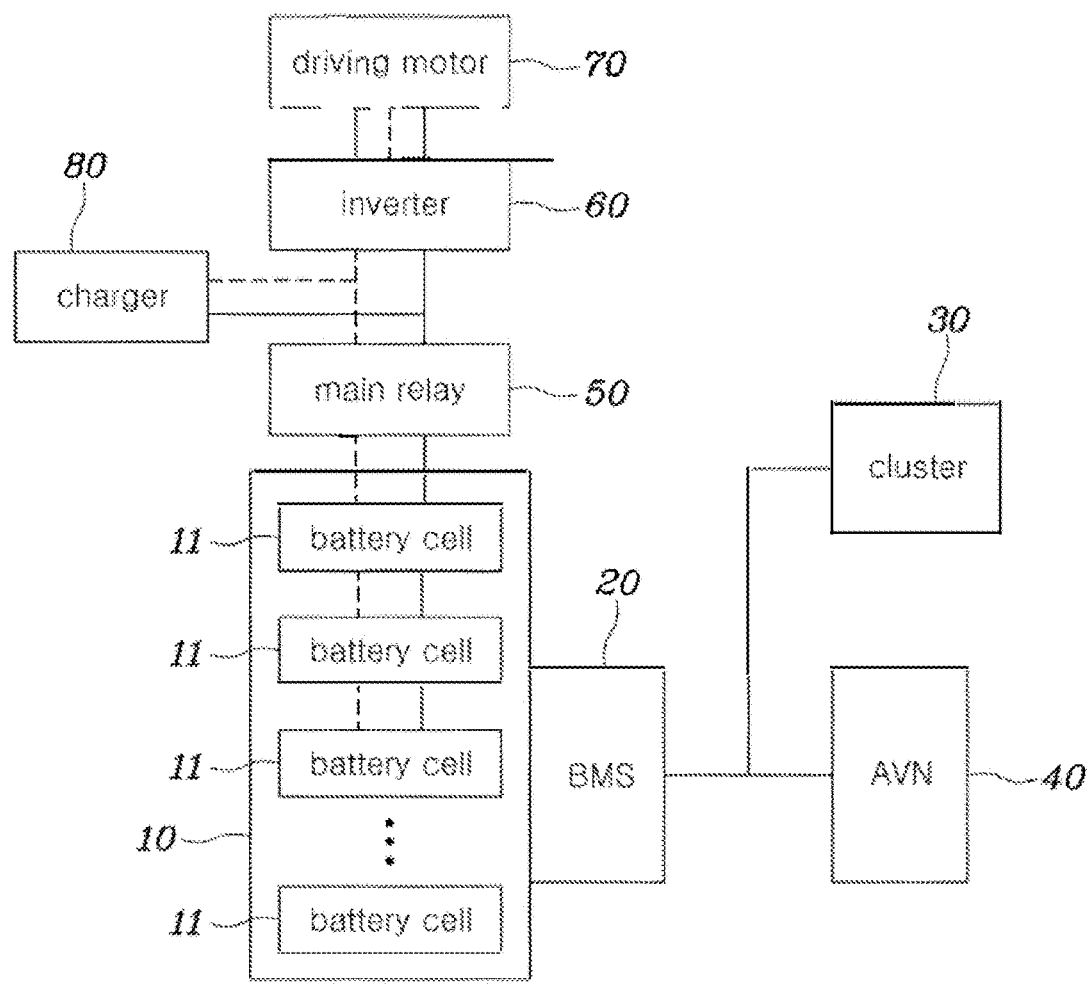
FIG. 1 is a block diagram of a system for managing a vehicle battery according to an embodiment of the present invention.

FIG. 1 is a block diagram of a system for managing a vehicle battery according to an embodiment of the present invention.

Referring to FIG. 1, a system for managing a vehicle battery according to an embodiment of the present invention may include a battery 10 that has a plurality of battery cells 11 and stores energy to be provided to a driving motor 70 of a vehicle, and a battery management system (BMS) 20 corresponding to a controller that receives a battery-related parameter such as the voltage, current, and temperature of the battery 10, a total mileage of the vehicle, and whether the vehicle is driven/charged, monitors the voltage of the plurality of battery cells 11 in the battery 10 under a specific condition, and determines whether the battery is abnormal based on the deviation of the voltages of the monitored battery cells 11.

The battery 10 may include the plurality of battery cells 11 connected to each other in a series-parallel relationship to form an entire voltage of the battery. The plurality of battery cells 11 may form a unit voltage, and the entire voltage of the battery 10 may be determined by the number of the plurality of battery cells 11 and the series/parallel connection relationship. In general, since the battery 10 is manufactured to include the plurality of battery cells 11 having the same specification, ideally the voltages of all the battery cells 11 should be the same. However, the voltages of the plurality of battery cells 11 may have deviation due to errors in the manufacturing process of the battery cells 11, and in the case of a normal battery, the voltages of the battery cells should be maintained within a preset allowable deviation.

If abnormality is occurred in some battery cells due to external environmental factors or manufacturing defects of the battery cells themselves, the corresponding battery cells may have excessively high voltages or excessively low voltages compared to the remaining normal battery cells. Accordingly, it is possible to determine whether the battery cell or the battery including the battery cells is abnormal based on the voltage deviation of the plurality of battery cells included in the battery.

In addition, the system for managing a vehicle battery according to an embodiment of the present invention may include a cluster 30 or an audio video navigation (AVN) 40 that displays the occurrence of abnormality to notify it to an external vehicle management server or a driver terminal, when it is determined that a battery abnormality is occurred in the battery management system 20.

In FIG. 1, the reference numeral '50' denotes a main relay that establishes or disconnects an electrical connection between the battery 10 and other components in the vehicle, and the reference numeral '60' denotes an inverter that converts the DC power stored in the battery 10 to the three-phase AC current used in the driving motor 70, and the reference numeral '80' denotes a charger that supplies charging power for charging the battery 10 to the battery.

The main relay 50 may be controlled to be in a short-circuit/open state by a controller (e.g., the battery management system 20 or another in-vehicle controller not shown).

When driving of the vehicle is required, the controller controls the main relay 50 to be in a short-circuit state so that the power stored in the battery 10 is provided to the inverter 60 so that power conversion is performed by the inverter 60, thereby generating a driving force in the driving motor 70. The driving motor 70 may be connected to a driving shaft of the vehicle to rotate the driving shaft to enable the vehicle for driving.

In addition, when charging of the battery 10 is required, the controller controls the main relay 50 to be in the short-circuit state so that the charging power provided from the charger 80 is applied to the battery 10 to charge the battery 10.

The charger 80 is installed in the vehicle and converts the AC power provided from an external charging facility into the DC power capable of charging the battery 10, or may be a charging facility itself outside the vehicle that provides a high DC charging current for fast charging.

In the description of the present invention, the parking state of the vehicle means a state in which the power of the vehicle is turned off after driving or charging of the vehicle is terminated, that is, a state in which the main relay 50 is opened. By opening the main relay 50, the battery 10 may be in a no-load state. In addition, through the control of the current provided from the charger, even in a state in which the main relay 50 is short-circuited, the magnitude of the current applied to the battery 10 may be substantially zero (0,) thereby making the battery 10 into a no-load state. A zero-current control for making the magnitude of the current applied to the battery 10 zero (0) in the state in which the main relay 50 is short-circuited is performed by controlling the charger 80 in consideration of the magnitude of the load used by the electric fields in the vehicle using the energy stored in the battery 10. Various methods known in the art may be applied to the technique for controlling the zero-current of the battery 10, and a separate detailed description of the zero-current control will be omitted.

In one embodiment of the present invention, the battery management system 20 may determine whether the battery 10 is abnormal based on the voltage behavior of the battery 10. In more detail, the battery management system 20 may determine whether the battery 10 is abnormal based on the polarization voltage of each battery cell 11 in the battery 10.

In the system and method for managing a vehicle battery according to an embodiment of the present invention, the controller (battery management system 20) monitors voltages of the plurality of battery cells 11 included in a battery 10, and determines that abnormality is occurred in the battery when the voltage deviation between the battery cells 11 is greater than a preset reference value.

Figure 2:
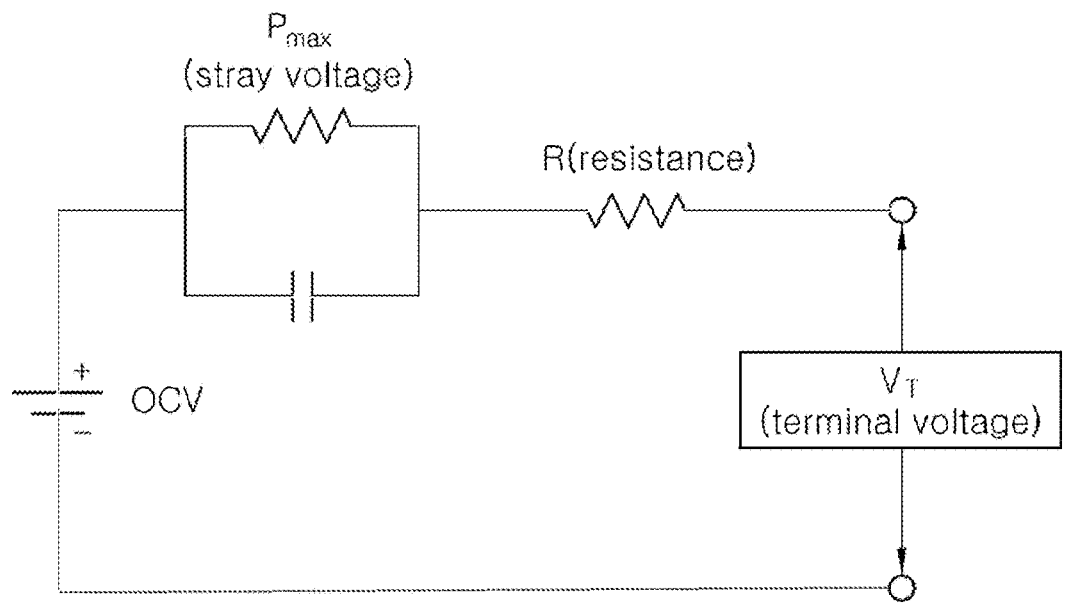
FIG. 2 is a circuit diagram illustrating an equivalent circuit model of a general battery.
Figure 3:
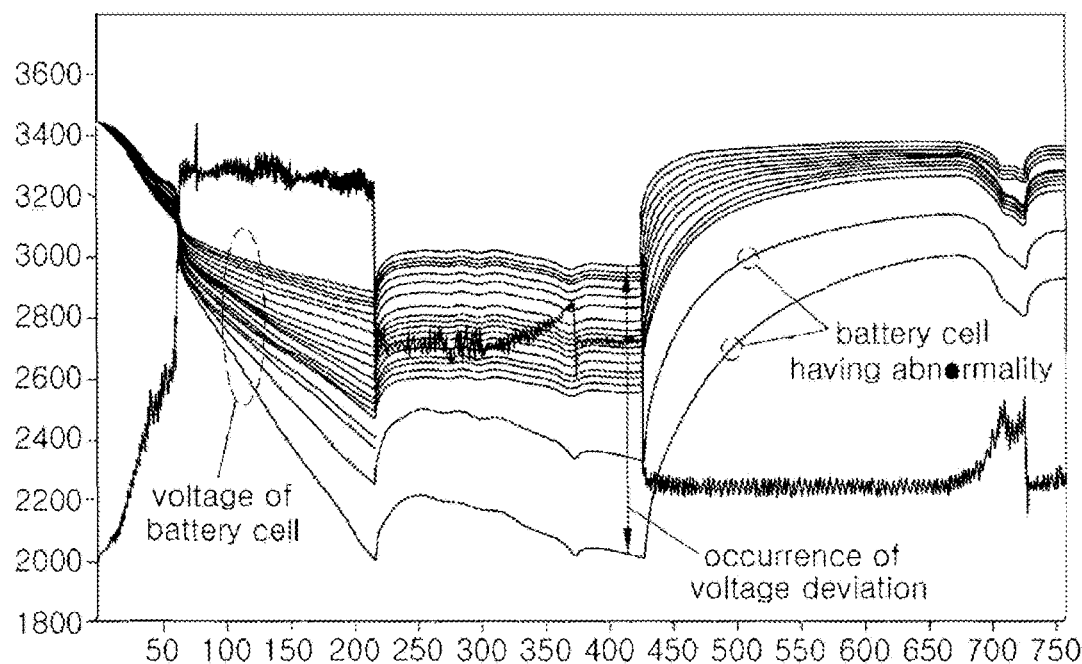
FIG. 3 is a graph illustrating an example of a battery cell voltage deviation appearing in a battery in which abnormality is occurred.

FIG. 2 is a circuit diagram illustrating an equivalent circuit model of a general battery, and FIG. 3 is a graph illustrating an example of a battery cell voltage deviation appearing in a battery in which abnormality is occurred.

As shown in FIG. 2, the battery may have a capacitor component and a resistance component therein, and show a specific voltage behavior over time when a current is input to the battery or a current is output from the battery by the capacitor component and the resistance component. Even for battery cells produced with the same design, that is, the battery cells included in one battery pack, the voltage behavior with respect to current input of each cell may be different as the magnitude of the internal resistance component is changed due to deterioration or the state of the battery cell.

For example, a battery cell failure due to a short circuit inside the battery cell or a foreign substance existing inside the battery cell causes a change in the internal capacitance or internal resistance of the battery cell, and the behavior of voltage change of the battery cell during and after the application of current is different from those of other battery cells.

As shown in FIG. 3, in a battery in which abnormality is occurred, some battery cells therein may have excessively different voltages than those of other battery cells.

In the case of an abnormal battery cell in which abnormality is occurred, in general, the internal resistance is excessively increased, and thus, a voltage change occurs larger than those of normal battery cells when a current is input to or output from the battery 10. As the degree of abnormality increases, the amount of variation in the voltage of the abnormal battery cell may become larger.

However, while the vehicle is driving, the fluctuation range of the current output from the battery 10 is large depending on the driving environment of the vehicle, and the voltage behavior for each battery cell 11 may also vary greatly depending on the fluctuation of the current output from the battery 10. Thus, in the system and method for managing a vehicle battery according to an embodiment of the present invention, the voltage behaviors of the battery cells 11 are monitored in a state in which the current of the battery 10 is stabilized.

The battery management system 20 as a controller may monitor the voltage deviation between the battery cells 11 during charging in which a constant current is applied to the battery or in a no-load state in which no current is applied to the battery itself to perform a diagnosis on the battery state.

When charging the battery, the charger 80 has a constant current charging period that provides a voltage of a certain magnitude to the battery 10. In one embodiment of the present invention, the battery management system 20 may measure the voltage of each of the plurality of battery cells 11 in this constant current charging period, and may determine whether the battery cells 11 are abnormal by comparing the difference between a maximum value and a minimum value among the measured voltages of the respective battery cells 11 with a preset reference value.

Similarly, when the battery 10 is in a no-load state, the battery management system 20 may measure the voltage of each of the plurality of battery cells 11 and may determine whether the battery cells 11 are abnormal by comparing the difference between the maximum value and the minimum value among the measured voltages of the respective battery cells 11 with a preset reference value.

As described above, the no-load state of the battery 20 in which the current applied to the battery is zero (0) is achieved through the zero-current control that controls the magnitude of the charging current of the charger 80 in consideration of the power consumed by the electric field load connected to the battery 10 during battery charging, or this corresponds to a case in which the connection between the battery 10 and other electric field loads in the vehicle is completely cut off by opening the main relay 50. When the battery 10 is in the no-load state, a polarization phenomenon in which a voltage decreases may occur in the battery cells 11.

Figure 4:
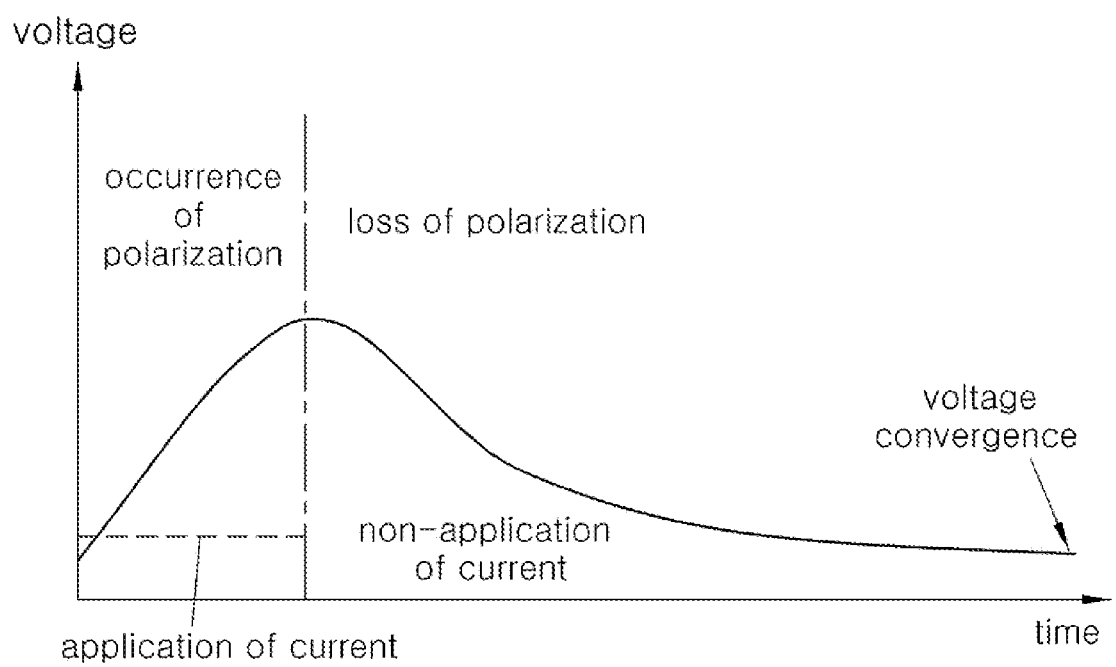
FIG. 4 is a graph illustrating a polarization voltage characteristic of a general battery.

FIG. 4 is a graph illustrating a polarization voltage characteristic of a general battery.

When the charging current is cut off while inputting energy (current) to the battery for charging, the voltage of the battery exhibits a behavior as shown in FIG. 4. Depending on the chemical characteristics of the battery cell, when the charging current is input to the battery, the voltage of the battery cell increases, and when the charging current applied to the battery is cut off (in the case of no-load), the voltage of the battery decreases.

That is, as shown in FIG. 2, when a current is input to the battery by the capacitor component and the resistance component inside the battery, a voltage drop occurs. After the input charging current is cut off, as the voltage drop due to the capacitor component and the resistance component decreases, the voltage of the battery gradually stabilizes and converges to a constant value.

In the relevant technical field, the amount of change in voltage of the battery that appears as described above after applying/cutting-off current to the battery is referred to as a polarization voltage.

In an embodiment of the present invention, the polarization voltage may be measured after a preset time elapses in a state in which the battery is in the no-load state and used to obtain a voltage deviation between the battery cells.

Figure 5:
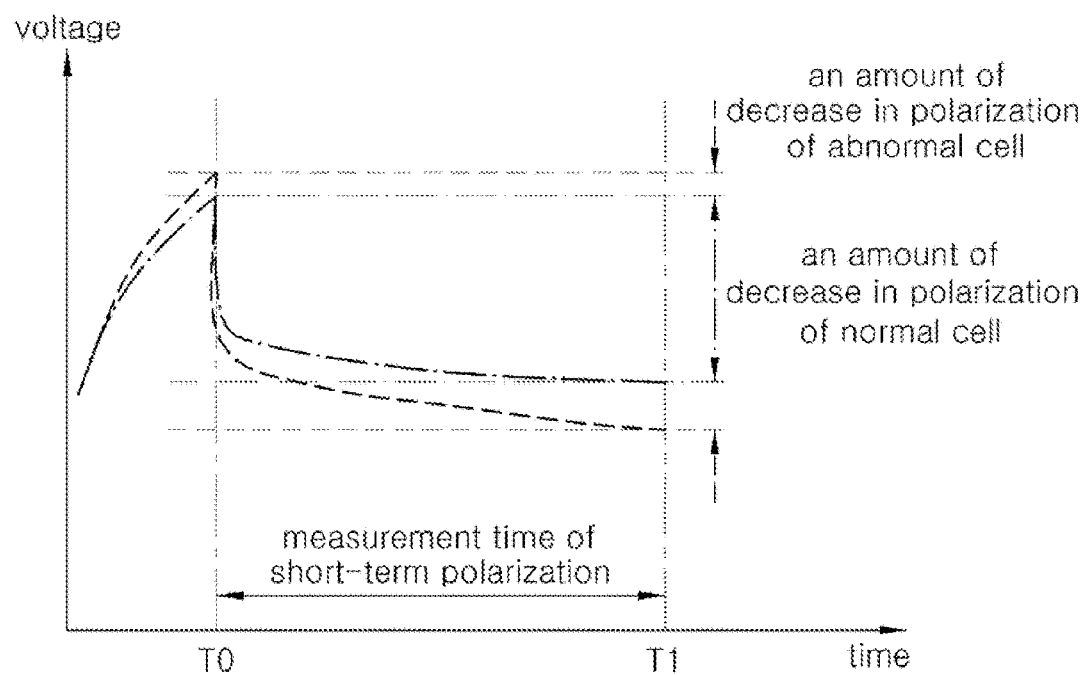
FIG. 5 is a graph for explaining an example of a polarization voltage used in a system and method for managing a vehicle battery according to an embodiment of the present invention.

FIG. 5 is a graph for explaining an example of a polarization voltage used in a system and method for managing a vehicle battery according to an embodiment of the present invention.

Referring to FIG. 5, the battery management system 20 may measure the polarization voltages of the plurality of battery cells 11 in the battery 10 for a preset short-term polarization measurement time corresponding to a time interval from a time point (T0) when charging of the battery is terminated to a preset time (T1).

As shown in FIG. 5, the polarization voltage of a battery cell in a normal state has a smaller value than the polarization voltage of a battery cell in an abnormal state, and accordingly, a voltage deviation between the battery cell in the abnormal state and the battery cell in the normal state occurs.

Therefore, by using an experimental method, the time point (T1) for measuring the polarization voltage and the reference value serving as a criterion for determining that the deviation of the polarization voltage is abnormal are determined in advance, and when the deviation of the measured polarization voltages between the plurality of battery cells is greater than the preset reference value, it may be determined that abnormality is occurred in the battery cells.

On the other hand, since a change in the internal resistance of a battery cell may be caused not only by a defect in the battery cell itself, but also by normal deterioration due to an increase in the number of times of battery use (the number of times of charging and discharging), it is necessary to consider the voltage deviation of a level that may occur due to a normal level of aging and deterioration of the battery in determining whether a battery is abnormal using the voltage deviation between the battery cells. In other words, when the usage period of the battery increases, the internal resistance of the battery continues to increase due to normal deterioration, thereby increasing the voltage deviation between the normal battery cell and the abnormal battery cell.

Accordingly, in an embodiment of the present invention, the reference value for detecting a battery cell failure may also be increased in consideration of an increase in voltage deviation that may occur due to an increase in the battery usage period or the number of times the battery is used.

The change of this reference value may be determined as shown in the following table based on a total mileage of the vehicle.

TABLE

| | ODO | | | | |
|---|---|---|---|---|---|
| | 30000 km | 50000 km | ... | 200000 km | 300000 km |
| reference value for voltage deviation | A mV | B mV | ... | C mV | D mV |

In above table, 'ODO' represents the total mileage of the vehicle, and the reference value for determining the voltage deviation may be set to gradually increase for each specific total mileage (A<B< . . . <C<D).

Meanwhile, this reference value may be changed using the polarization voltage of the battery as shown in FIG. 5.

The battery management system 20 may estimate the internal resistances of the battery cells 11 using the polarization voltage, and may estimate the degree of deterioration of the battery cells 11 based on the ratio of the estimated internal resistances and the preset magnitudes of the battery cells 11.

In the example shown in FIG. 5, the battery management system 20 may set the polarization voltage measurement time (T1) within 1 second from the time point (T0) when the battery charging current is cut off, and may measure the magnitude (Rn) of the internal resistance of the battery cell 11 according to Ohm's law using the charging current applied immediately before the charging current is cut off and the polarization voltage measured at the time point (T1). That is, the magnitude (Rn) of the internal resistance of the battery cell 11 may be estimated by dividing the measured polarization voltage by the charging current.

The battery management system 20 may determine the degree of deterioration of the battery cell 11 based on a ratio (Rn/R0) of the magnitude of the estimated internal resistance and the magnitude (R0) of the initial internal resistance of the battery cell 11 measured in advance in the initial state of the battery cell 11 (e.g., the state of the battery cell immediately after shipment from a factory).

The ratio (Rn/R0) of the magnitude of the estimated internal resistances of the battery cells 11 and the magnitude (R0) of the initial internal resistances is calculated for each specific mileage, and the reference value may be increased to correspond to the calculated ratio in consideration of the battery degradation level set at a preset maximum mileage according to a battery design specification.

Figure 6:
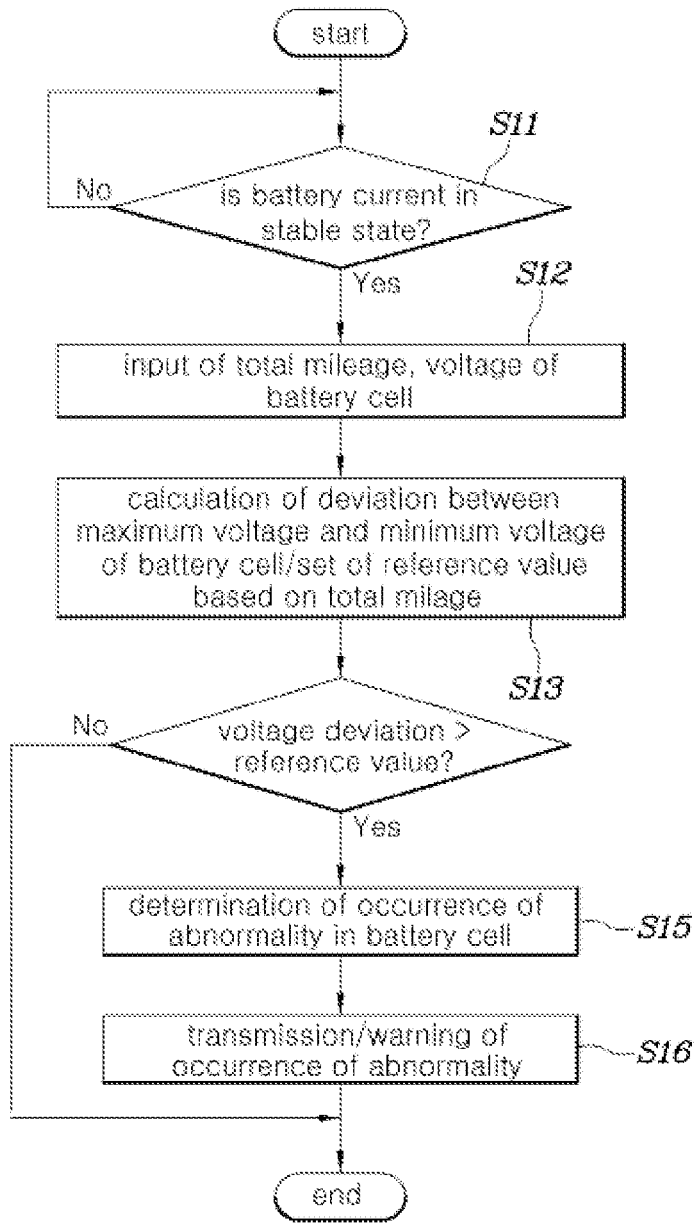
FIG. 6 is a flowchart illustrating a method for managing a vehicle battery according to an embodiment of the present invention.

FIG. 6 is a flowchart illustrating a method for managing a vehicle battery according to an embodiment of the present invention.

Referring to FIG. 6, the method for managing a vehicle battery according to an embodiment of the present invention may be started from the step (S11) in which the controller (battery management system 20) determines whether a battery current is in a stable state capable of calculating the voltage deviation of the battery cells 11.

The battery current stable state is a state in which constant current charging is made from the charger 80 to the battery 11 or a state in which the charging current applied to the battery 10 is zero (0) when the charger 80 is controlled to zero-current or a state in which the main relay 50 is in an off state.

Next, when it is determined that the battery current is in a stable state, the controller may receive the total mileage of the vehicle from another controller in the vehicle, and may receive voltages of the respective battery cells 11 (S12). The voltages of the plurality of battery cells 11 may be detected by a voltage sensor (not shown) provided in the battery 10 to detect the voltages of the battery cells 11, and the controller may be provided with the voltage magnitude detected from the voltage sensor.

Next, the controller may calculate a difference between a maximum value and a minimum value among voltages of the plurality of battery cells and may determine a reference value based on the total mileage of the vehicle (S13).

In the step (S13), the controller may measure the polarization voltages of the plurality of battery cells, and may calculate a difference between a maximum value and a minimum value among the polarization voltages. Here, the calculated difference between the maximum value and the minimum value among the polarization voltages of the plurality of battery cells may be compared with a reference value in a subsequent step (S14).

Next, the controller may compare the difference between the maximum value and the minimum value among the voltages of the plurality of battery cells calculated in the step (S13) or the difference between the maximum value and the minimum value among the polarization voltages of the plurality of battery cells with the reference value (S14).

In the step (S14), when it is determined that the difference between the maximum value and the minimum value among the voltages of the plurality of battery cells or the difference between the maximum value and the minimum value among the polarization voltages of the plurality of battery cells is greater than the reference value, the controller may determine that abnormality is occurred in some of the battery cells 11 included in the battery 10 (S15).

In the step (S16), the controller may transmit the occurrence of abnormality in the battery cells 11 of the battery 10 to the cluster 30 or AVN 40 of the vehicle to display the occurrence of abnormality in the battery cells on the cluster 30 or the AVN 40 (S16). When the cluster 30 or the AVN 40 is equipped with a wireless communication module, the cluster 30 or the AVN 40 may notify the occurrence of abnormality in the battery cells to a remote vehicle management server or a wireless terminal of preregistered driver through the wireless communication module.

As described above, the system and method for managing a vehicle battery according to various embodiments of the present invention may determine stably whether the battery is abnormal based on the deviation of the battery voltages by calculating the voltage deviation of the battery cells in a state in which a constant current is applied to the vehicle battery or in the no-load state of the battery.

In particular, since the system and method for managing a vehicle battery according to various embodiments of the present invention may determine whether the battery is abnormal based on the voltage deviation of the battery cells even in a parked state, so that it is possible to prevent in advance the occurrence of a serious accident, such as a sudden ignition of a battery in a parked vehicle.

In addition, the system and method for managing a vehicle battery according to various embodiments of the present invention may accurately determine whether the abnormality is occurred in the battery cells until a battery lifespan expires by changing the reference value compared with the voltage deviation of the battery cells to determine the abnormality of the battery according to the number of times or period of use of the battery.

Although specific embodiments of the present invention have been illustrated and described above, it will be apparent to those skilled in the art that the present invention can be variously improved and changed within the scope of the claims.

| DESCRIPTION OF REFERENCE NUMERALS | |
|---|---|
| 10: battery | 11: battery cell |
| 20: battery management system (BMS) | |
| 30: cluster | |
| 40: AVN | 50: main relay |
| 60: inverter | 70: driving motor |
| 80: charger | |

What is claimed is:

1. A system for managing a vehicle battery that is chargeable/dischargeable and stores energy for driving a vehicle driving motor, the system comprising:
a controller that measures a polarization voltage corresponding to a decrease in voltage of each of a plurality of battery cells in the vehicle battery that occurs during a preset time interval from a time point when the vehicle battery starts with a no-load state, and determines whether the plurality of battery cells is abnormal based on the deviation between the polarization voltages of the plurality of battery cells.

2. The system for managing the vehicle battery according to claim 1, wherein the controller measures the voltage of each of the plurality of battery cells when the vehicle battery is charged with a constant current.

3. The system for managing the vehicle battery according to claim 1, wherein the controller measures the voltage of each of the plurality of battery cells when the vehicle battery is in a no-load state.

4. The system for managing the vehicle battery according to claim 1, further comprising a cluster or an audio video navigation (AVN) that displays occurrence of abnormality in the battery cells when the controller determines that abnormality is occurred in the battery cells.

5. The system for managing the vehicle battery according to claim 4, wherein the cluster or the AVN includes a communication module that wirelessly transmits the occurrence of abnormality in the battery cells to a vehicle management server or a wireless terminal of a driver of the vehicle.

6. A system for managing a vehicle battery that is chargeable/dischargeable and stores energy for driving a vehicle driving motor, the system comprising: a controller that measures a voltage of each of a plurality of battery cells in the vehicle battery and compares a deviation between a maximum value and a minimum value among the measured voltages of the plurality of battery cells with a preset reference value, and determines that abnormality is occurred in the battery cells when the deviation between the maximum value and the minimum value is greater than the reference value, wherein the reference value is preset to be a larger value as a total mileage of the vehicle increases.

7. A system for managing a vehicle battery that is chargeable/dischargeable and stores energy for driving a vehicle driving motor, the system comprising: a controller that measures a voltage of each of a plurality of battery cells in the vehicle battery and compares a deviation between a maximum value and a minimum value among the measured voltages of the plurality of battery cells with a preset reference value, and determines that abnormality is occurred in the battery cells when the deviation between the maximum value and the minimum value is greater than the reference value, wherein the controller measures a polarization voltage corresponding to a decrease in voltage of each of the plurality of battery cells in the vehicle battery for a preset time interval immediately after charging of the vehicle battery is terminated, for each preset total mileage of the vehicle, and determines the reference value corresponding to the preset total mileage based on a magnitude ratio of the polarization voltage and a charging current applied to the vehicle battery immediately before charging of the vehicle battery is terminated.

* * * * *